United States Patent [19]

Coldren et al.

[11] Patent Number: 4,622,672
[45] Date of Patent: Nov. 11, 1986

[54] SELF-STABILIZED SEMICONDUCTOR LASERS

[75] Inventors: Larry A. Coldren, Holmdel, N.J.; Karl J. Ebeling, Gleichen, Fed. Rep. of Germany

[73] Assignee: AT&T Bell Laboratories, Murray Hill, N.J.

[21] Appl. No.: 572,682

[22] Filed: Jan. 20, 1984

[51] Int. Cl.[4] .............................................. H01S 3/10
[52] U.S. Cl. ....................................... 372/32; 372/92; 372/97
[58] Field of Search ...................... 372/50, 29, 32, 92, 372/97

[56] References Cited

PUBLICATIONS

W. Bludau et al, "Characterization of Laser-to-Fiber Coupling Techniques by their Optical Feedback", *Applied Optics*, vol. 21, No. 11, Jun. 1982, pp. 1933-1939.

K. R. Preston, "Simple Spectral Control Technique for External Cavity Laser Transmitters", *Electronics Letters*, vol. 18, No. 25, (1982), pp. 1092-1094.

W. Tsang, N. A. Olsson and R. A. Logan, "High-Speed Direct Single-Frequency Modulation with Large Tuning Rate and Frequency Excursion in Cleaved-Coupled-Cavity Semiconductor Lasers", *Applied Physics Letters*, vol. 42, No. 8, (1983), pp. 650-652.

H. Kogelnik and C. V. Shank, "Stimulated Emission in a Periodic Structure", *Applied Physics Letters*, vol. 18, No. 4, (1971), pp. 152-154.

K. J. Ebeling, L. A. Coldren, B. I. Miller and J. A. Rentschler, "Generation of Single-Longitudinal-Mode Subnanosecond Light Pulses by High-Speed Current Modulation of Monolithic Two-Section Semiconductor Lasers", *Electronics Letters*, vol. 18, No. 21, (1982), pp. 901-902.

*Primary Examiner*—James W. Davie

[57] ABSTRACT

A control circuit for stabilizing the emission wavelength of the coupled cavity semiconductor laser is described which uses measurements of the voltage across the laser cavity to maintain stable single longitudinal mode output.

12 Claims, 3 Drawing Figures

SELF-STABILIZED SEMICONDUCTOR LASERS

TECHNICAL FIELD

This invention relates generally to semiconductor lasers and particularly to such lasers that operate stably with a single longitudinal mode output.

BACKGROUND OF THE INVENTION

Optical communications systems as presently contemplated and constructed use a light source, such as a semiconductor laser or light emitting diode, which is optically coupled to a photodetector through a glass transmission line. The transmission line is commonly referred to as an "optical fiber." Either amplitude or frequency modulation may be used to convey information. If amplitude modulation is used, the information is transmitted as a bit stream of 1's and 0's with the bits being both transmitted and detected within predetermined time intervals.

Such systems presently operate at wavelengths between approximately 0.8 $\mu$m and approximately 1.6 $\mu$m with the longer wavelengths, that is, the wavelengths greater than appoximately 1.2 $\mu$m, presently being considered most desirable for many systems applications because optical fibers presently used exhibit minimum loss and dispersion within this wavelength range. These characteristics facilitate design of optical communications systems having desirable properties such as high transmission rates, long distances between repeaters. etc.

However, to most efficiently utilize the minimum loss and dispersion properties of the optical fibers, the light source should not only emit radiation within this wavelength range but should also have its output concentrated in a narrow spectral range. In practical terms, this means that the light source should be a semiconductor laser emitting output of a single longitudinal mode. A single longitudinal mode is narrow enough in spectral width that it may be thought of as being a single frequency. The output contains unwanted secondary modes but these are greatly suppressed in intensity with respect to the wanted primary mode. The requirement that the output be a single longitudinal mode is easily understood by considering that a finite width pulse will spread, i.e., broaden, because of the dispersion properties of the fiber. If the spread becomes large enough, adjacent pulses will overlap and recovery of the transmitted information by the receiver will be impossible; i.e., the bits will not arrive at the photodetector within the proper time interval.

Accordingly, a variety of approaches has been taken in attempts to develop single longitudinal mode lasers. For example, distributed feedback (DFB) lasers have been developed. See, for example, *Applied Physics Letters*, 18, pp. 152-154, Feb. 15, 1971. Semiconductor lasers operating with an external cavity to produce single mode operation have been reported. See, for example, *Electronics Letters*, 18, pp. 1092-1094, Dec. 9, 1982. Additionally, coupled cavity lasers have been developed and have been shown to produce single longitudinal mode output even under high speed modulation. See for example, *Electronics Letters*, 18, pp. 901-902, Oct. 14, 1982, and *Applied Physics Letters*, 42, pp. 650-652, Apr. 15, 1983.

The operation of a coupled cavity laser is described in detail in the preceding references and may be briefly summarized as follows. A coupled cavity laser has two cavities which are optically coupled to each other. Each cavity has separate electrical contacts, i.e., the laser is a three-terminal device. One cavity operates as an oscillator while the other cavity acts as an etalon and provides mode selection. That the laser produces a single mode output is understood, for the case of gap widths approximately n$\lambda$/2, where n is an integer and $\lambda$ is the wavelength of the radiation, by considering that the mode of the coupled cavity laser must satisfy Fabry-Perot mode conditions in both cavities. More generally, modes are enhanced at local loss minima because of the constructive interference of optical energy reflected from the gap with that fed back from the other cavity, i.e., the etalon. This may occur near resonance or antiresonance of the etalon as well as intermediate points. This is possible only for a limited number of discrete frequencies.

Variation of the etalon current permits tuning of the wavelength across the gain profile of the laser. However, a large number of mode hops may occur as the etalon current is increased from zero to values above threshold. Although stable output is observed between the mode hops, the mode hop boundaries, as a function of etalon current, vary with temperature and also perhaps with device aging. Thus, simply maintaining the etalon current at a constant value will not guarantee stable single mode operation. Mode hops are undesirable because they may cause information to be lost because, for example, bits are not transmitted as desired or they are lost because they are not received within the proper time interval. Thus, techniques to maintain single mode operation at a desired wavelength are desirable.

Wavelength stabilization techniques have been previously developed for both coupled cavity lasers as well as various other types of lasers such as semiconductor lasers operating with an external cavity. A common element of these prior art schemes is the requirement of an external optical element, such as either a photodetector or a spectrometer, to monitor the light output from, e.g., the laser. Feedback loops are then used to adjust, for example, the laser current or a property of the external cavity such as its length if it is a passive cavity.

SUMMARY OF THE INVENTION

We have found that wavelength stabilization of a semiconductor laser having two cavities optically coupled to each other, such as a coupled cavity laser, may be obtained by using the lasing cavity as a photodetector to provide a discrimination signal for a feedback control circuit. The feedback control circuit comprises means for measuring the voltage variation across the laser cavity, means for comparing the measured voltage to a reference characteristic, and means for varying a property of a second cavity by an amount determined by said comparing step. In one embodiment, the laser is a coupled cavity laser and the circuit comprises a dc blocking circuit, a phase-sensitive detector which is electrically connected to the laser cavity, and a reference oscillator electrically connected to both the blocking circuit and the phase-sensitive detector. The output from the phase-sensitive detector goes to an amplifier where it is compared to a reference value. The outputs from the amplifier, which is a function of the difference between the measured and references voltages, and blocking circuit are superimposed on the etalon current.

DETAILED DESCRIPTION

Figure 1:
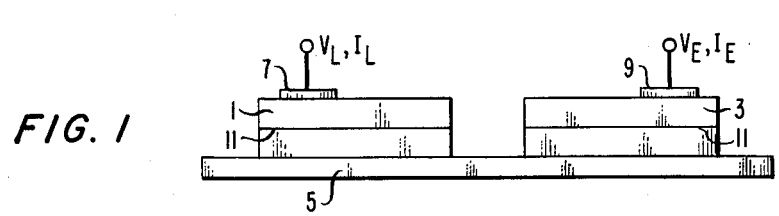
FIG. 1 is a schematic representation of a coupled cavity semiconductor laser.

Our invention will be specifically described by reference to the coupled cavity laser schematically depicted in FIG. 1. For reasons of clarity, the elements of the device are not drawn to scale. The laser comprises laser cavity 1, etalon 3, electrode 5, laser electrode 7, and etalon electrode 9. Electrode 5 is a common electrode and contacts both the laser cavity and the etalon. Both cavities comprise a narrow active stripe 11 where electron hole recombination takes place when the laser cavity and etalon are forward biased. The laser and etalon cavities are spaced from each other but are optically coupled to each other. The space between the cavities may be formed by, for example, etching or cleaving a unitary structure. The details of exemplary laser and etalon cavities, as well as their fabrication, are well known to those skilled in the art and need not be further described in detail.

As shown, currents $I_L$ and $I_E$ flow through the laser and etalon cavities, respectively. The voltages across the two cavities are $V_L$ and $V_E$ for laser and etalon cavities, respectively.

The operation of the control circuit will be better understood if the operation and light output characteristics of the coupled cavity laser are first explained by assuming that a constant current, $I_L$, which is above threshold, flows through the lasing section. If the magnitude of the etalon current is now varied, the changes, $dI_E$, of the etalon current cause variations of the light distribution within the coupled cavity system. These variations also lead to variations, $dV_L$, of the lasing junction voltage as a consequence of the internal photoeffect. These variations are typically extremely small.

Figure 2:
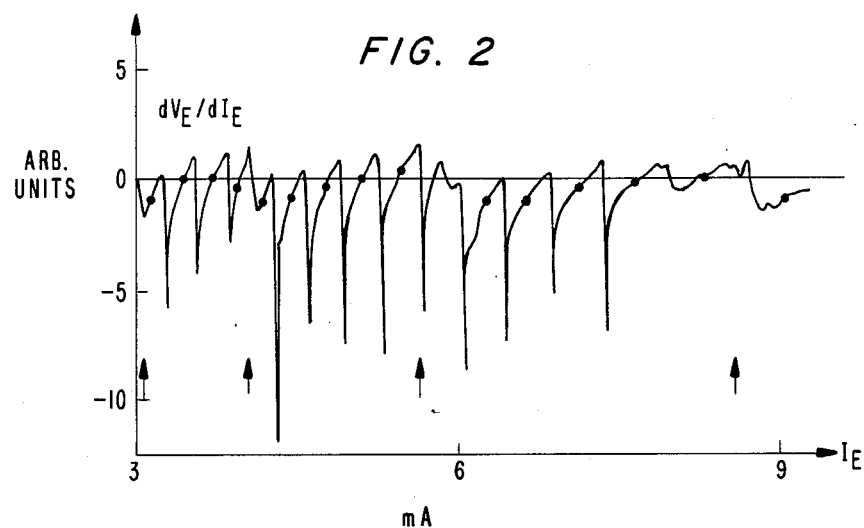
FIG. 2 plots a typical differential voltage (laser)/current (etalon) characteristic, i.e., $dV_L/dI_E$, vertically versus the etalon current horizontally in units of mA.

FIG. 2 shows a typical differential signal, $dV_L/dI_E$, plotted vertically in arbitrary units as a function of the etalon current plotted horizontally in units of mA. The laser was an InGaAsP/InP buried crescent coupled cavity laser emitting at 1.3 μm. The lengths of the two cavities were 222.0 and 191.0 μm and the space between them was less than 1.0 μm. The current through the lasing section was 20 mA above threshold. The laser produces stable single mode output when the etalon current is above 3 mA.

As the etalon current increases, mode hops occur to neighboring modes as well as across the entire gain profile of the semiconductor laser. The arrows indicate mode hops across the entire gain profile. It was found that a mode hop results in a sudden decrease in the differential signal with an abrupt mode hop producing a sharp negative peak while a more gradual mode transition produces a comparatively smooth step. Between successive mode transitions, the differential signal usually increases as the etalon current increases. Thus, the behavior of the junction voltage, $V_L$, is a function of the etalon current, $I_E$, and may be used to detect mode hopping. The points of maximum suppression, with respect to the primary mode, of the unwanted secondary modes are indicated by the solid circles. These circles generally lie approximately in the center of each single mode regime. The $dV_L/dI_E$ slope may therefore be used as a discriminating signal. The wavelength stabilization circuit of this invention tracks the etalon current to the point of optimum mode suppression and maintains the current at that point by adding the amplified discriminating signal to the preset etalon bias current. If the etalon current is preset before the feedback loop is turned on, the desired mode can be maintained.

Figure 3:
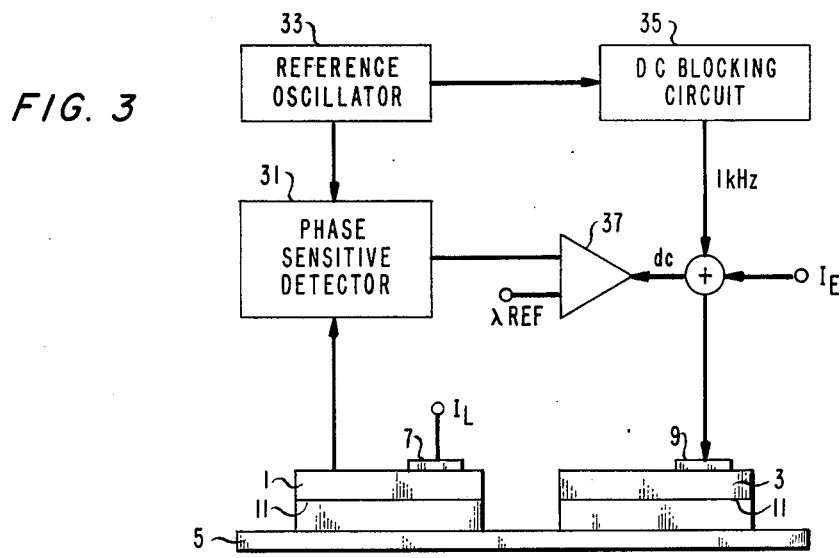
FIG. 3 is a schematic representation of a wavelength stabilized coupled cavity semiconductor laser according to our invention.

FIG. 3 is a schematic representation of our wavelength stabilization circuit. In addition to the laser elements described with respect to FIG. 1, the stabilization circuit further comprises a phase-sensitive detector 31, a reference oscillator 33, a dc blocking circuit 35, and an amplifier 37. The output from the reference oscillator goes to both the dc blocking circuit and the phase-sensitive detector. The phase-sensitive detector is connected to the laser cavity and to an amplifier which also has a reference input, $\lambda_{ref}$. The amplifier output is a function of the difference between the signal from the phase-sensitive detector and $\mu_{ref}$. The output of the amplifier, dc blocking circuit, and the etalon current, $I_E$, are combined and sent to the etalon cavity. Each of these elements is well known to those skilled in the art and need not be described in further detail.

The laser cavity is driven above threshold and a small dither signal from the dc blocking circuit is superimposed on the etalon current. A typical amplitude is 10 μA and a typical frequency is 1 kHz. The corresponding ac voltage change at the lasing cavity is detected with the phase-sensitive detector. If the measured ac signal deviates from a reference value, indicated as $\lambda_{ref}$, required for optimum suppression of the unwanted secondary modes, a dc correction current is fed from the amplifier to the etalon thereby forcing the overall etalon current to the optimum value.

The laser section current, for the laser previously described, was set at $I_L = 20$ mA above threshold and the etalon current was set at 11.1 mA to select the desired mode. The temperature was then varied and the output spectra recorded. With the wavelength control circuit on, the emission stayed in the same mode over the temperature range between 14 degrees C. and 26 degrees C. while several mode hops occurred with the circuit off.

It will be readily appreciated that our circuit may be used with other types of lasers. For example, the feedback circuit may be used to adjust the length of the external cavity used with a semiconductor laser.

What is claimed is:

1. A wavelength-stabilized semiconductor laser comprising a laser cavity, a second cavity, said laser cavity and said second cavity being optically coupled to each other, means for measuring a voltage variation across the laser cavity, means for comparing the measured voltage to a reference characteristic, and means for varying a property of said second cavity by an amount determined by said comparing step.

2. A laser as recited in claim 1 in which said laser comprises a coupled cavity laser and said second cavity comprises an etalon.

3. A laser as recited in claim 2 in which said means for varying changes the current to the etalon.

4. A laser as recited in claim 1 in which said second cavity comprises an external cavity optically coupled to said laser cavity.

5. A laser as recited in claim 4 in which said means for varying changes the optical length of said external cavity.

6. A laser as recited in claim 1 in which said means for measuring comprises a reference oscillator and a phase-sensitive detector electrically connected to said laser and to said oscillator.

7. A laser as recited in claim 6 in which said means for comparing comprises an amplifier having an input from said detector and a reference input, said amplifier having an output.

8. A laser as recited in claim 7 in which said means for varying comprises the output of said amplifier.

9. A laser as recited in claim 8 in which said laser comprises a coupled cavity laser and said second cavity comprises an etalon.

10. A laser as recited in claim 9 in which said means for varying changes the current to the etalon.

11. A laser as recited in claim 8 in which said second cavity comprises an external cavity optically coupled to said laser cavity.

12. A laser as recited in claim 11 in which said means for varying changes the optical length of said external cavity.

* * * * *